United States Patent [19]

Tench et al.

[11] Patent Number: 5,104,494

[45] Date of Patent: Apr. 14, 1992

[54] METHOD OF RESTORING SOLDERABILITY

[75] Inventors: D. Morgan Tench, Ventura; Dennis P. Anderson, Newbury Park, both of Calif.

[73] Assignee: Rockwell International Corp., Seal Beach, Calif.

[21] Appl. No.: 724,644

[22] Filed: Jul. 2, 1991

[51] Int. Cl.$^5$ .............................................. C25D 11/00
[52] U.S. Cl. .................................................. 205/125
[58] Field of Search .......................................... 204/15

[56] References Cited

U.S. PATENT DOCUMENTS 1,749,549  3/1930  Slepian .................................. 204/15

Primary Examiner—T. M. Tufariello
Attorney, Agent, or Firm—John C. McFarren

[57] ABSTRACT

A low-temperature, nondestructive method of electrochemical reduction is provided for restoring solderability of oxidized electronic component leads and solderable portions of printed wiring boards. The component or circuit board is immersed in an electrolyte solution. The electrolyte is chosen to be non-reactive with the circuit board and component materials. In one embodiment, the electrolyte comprises a benign borate buffer solution. The solderable portion of the component or circuit board is connected to the cathode of an electric power source to form a first electrode. A second, inert electrode is connected to the anode of the current source and immersed in the electrolyte. Current passing between the electrodes electrochemically reduces the metallic oxides on the solderable portions of the component or circuit board. In a second embodiment, the electrolyte comprises an active reducing agent. When the solderable portion of the component or circuit board is immersed in the reducing agent, localized galvanic action causes reduction of any metallic oxides without connection to an external power source. This is particularly useful for restoring solderability of printed wiring boards having non-interconnected circuitry. Reduction of the oxides to their metallic form restores and ensures solderability of the solderable portions of the electronic component or printed wiring board.

15 Claims, 1 Drawing Sheet

METHOD OF RESTORING SOLDERABILITY

TECHNICAL FIELD

The present invention relates to the loss of solderability of electronic components and, in particular, to a method of reducing metallic oxides known to degrade solderability, thereby restoring and ensuring solderability of electronic component leads and printed wiring boards.

BACKGROUND OF THE INVENTION

A major cost problem experienced by the electronics industry is the loss of solderability of electronic components and printed circuit boards, particularly during storage. Poor solderability of component leads and printed wiring boards is believed to account for as much as 75% of solder joint failures. Because humid environments are known to exacerbate the problem, an electrochemical mechanism is clearly the cause of solderability degradation. In the lead-tin-copper solder system, for example, previous studies have determined that oxidation of the tin-lead (Sn—Pb) surface and underlying copper-tin (Cu—Sn) intermetallic layers is involved in the degradation process.

A traditional method of removing metallic oxides is the use of aggressive acids to dissolve the detrimental oxides. This method is undesirable for use with printed circuit boards, however, because the acids also attack the circuit board and component materials while dissolving the metallic oxides. Also, anions from such acids (e.g., chloride) can become incorporated in gummy flux residues. Such residues are difficult to remove completely, and they can cause corrosion and subsequent component failure. The alternative high-temperature oxide reducing processes known in the prior art are also destructive of component materials and thus unsuitable for use with printed wiring boards and electronic components.

Because degradation of solderability involves an electrochemical oxidation mechanism, it is believed that solderability of electronic components can be restored by reversing the process with a method that electrochemically reduces the detrimental metallic oxides. The availability of a low-temperature method for restoring the solderability of electronic circuitry and component leads will result in significant savings for the electronics industry and improved reliability of systems containing soldered components. Thus, there is a need for a low-temperature, nondestructive method that restores and ensures the solderability of electronic components and printed wiring boards.

SUMMARY OF THE INVENTION

The present invention comprises a method of restoring the solderability of oxidized electronic component leads and printed wiring boards. The process is applicable to the lead-tin-copper solder system, as well as to solder systems comprising other metals and alloys. The method electrochemically reduces metallic oxides that are known to degrade solderability when present on the solder surface and intermetallic layers of electronic components. The invention comprises a low-temperature, nondestructive method of electrochemical reduction that restores and ensures solderability of electronic components and printed wiring boards.

In the method of the present invention, an electronic component or printed wiring board, which has solderable portions that may have become oxidized, is immersed in a reagent. The reagent is chosen to be non-reactive with the non-solderable circuit board and component materials. In one embodiment, the reagent comprises a benign electrolyte, such as a borate buffer solution. The solderable portion of the component or circuit board is connected to the cathode of an electric power source to form a first electrode. A second, inert electrode is connected to the anode of the electric power source and immersed in the electrolyte. Current passing between the electrodes electrochemically reduces the metallic oxides on the solderable portions of the component or circuit board. In a second embodiment, the reagent comprises an active reducing agent comprising borohydride ions, chromous ions, dimethylaminoborane, or hydrazine, for example. When the solderable portion of the component or circuit board is immersed in the reducing agent, localized galvanic action takes place between the metal/reducing agent and any metallic oxides present. This action causes the metallic oxides to be electrochemically reduced without connecting the component or circuit board to an outside power source. This embodiment is particularly useful for restoring solderability of printed wiring boards having circuitry that is not interconnected. With either embodiment, the time at which the reduction process is complete can be determined by measuring the cathode voltage versus a reference electrode. The cathode voltage becomes more negative as reduction proceeds and then levels off when all oxides have been reduced. The reduction of oxides to their metallic form restores and ensures solderability of the solderable portions of the electronic component or printed wiring board.

A principal object of the present invention is to restore and/or ensure the solderability of electronic components and printed circuit boards, thereby reducing costs and improving the quality and reliability of systems having soldered components. A feature of the invention is the use of a method that electrochemically reduces the metallic oxides that cause loss of solderability in electronic components. An advantage of the invention is that it provides a low-temperature, nondestructive method of restoring solderability that is easy to perform and is not detrimental to printed wiring boards.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Solder coatings are widely used to protect copper in printed wiring boards and electronic component leads from oxidation that can lead to loss of solderability. A typical solder coating comprises eutectic Sn—Pb, for example, that can be applied directly by hot dipping, or that can be electroplated and then densified by reflowing (melting). When sufficiently thick and properly applied, solder coatings can retain their original solderability even after several years of normal storage. However, solder coatings frequently oxidize and lose solderability as a result of poor coating quality and/or poor storage environment.

Initial tests of the method of the present invention were conducted on steam aged test specimens. A typical test specimen was a 1.5 mm diameter hard Cu wire, 2.5 cm in length, that was masked with Teflon ® heat-shrink tubing to expose a 1 cm long section with a rounded end. The exposed section was electroplated with 0.4 mil of 60-40 eutectic Sn—Pb from a standard fluoroborate bath at room temperature. The Sn—Pb coating was reflowed at 235° C., and then the specimen was steam-aged for 16 hours.

Figure 1:
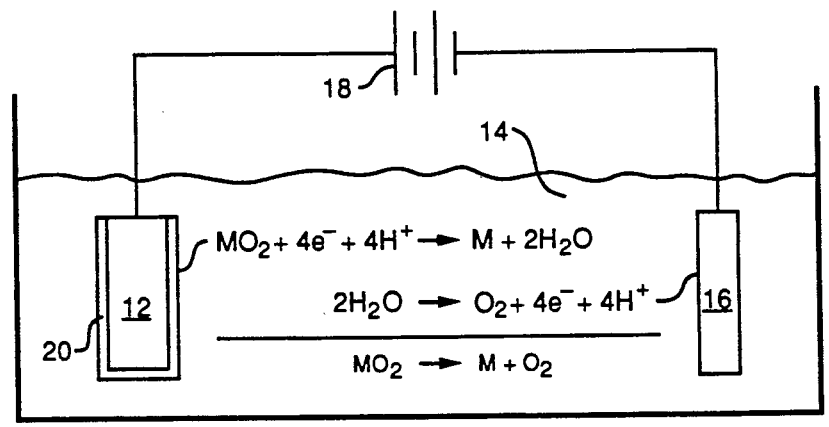
FIG. 1 is a schematic depiction of the electrochemical reduction of metallic oxides on an electronic component immersed in an electrolyte solution and connected to an external source of electric power.

In a first variation of the method, as illustrated schematically in FIG. 1, electrochemical reduction was performed on steam aged specimens, such as component 12, immersed in a reagent, such as electrolyte 14. Electrochemical reduction was performed successfully using an electrolyte 14 comprising a borate buffer solution consisting of 0.1M boric acid (6.2 g/L) with approximately 0.1M $Na_2B_4O_7 \cdot H_2O$ added to adjust the pH to the range of 8.0 to 8.4. It should be obvious to those skilled in the art that other electrolytes compatible with a particular solder system may be used. Component 12 and a second inert electrode 16 (comprising platinum, for example) were connected to an electric power source 18 (which may comprise a battery, for example) and immersed in electrolyte 14. Component 12 is shown with a layer of metallic oxide 20 coating the solderable portion of component 12. A constant cathodic current of $-0.01$ to $-1.0$ mA/cm$^2$ was applied to component electrode 12 in the borate buffer solution 14 until oxide reduction occurred, as indicated by the electrode voltage leveling off at a plateau between $-1.2$ and $-1.5$ V as compared to a reference saturated calomel electrode (SCE, not shown). In some experiments, a constant voltage (e.g., $-1.3$ V versus SCE) was applied instead of a constant current, and comparable results were obtained. Bubbling an inert gas, such as nitrogen or argon, deaerates electrolyte 14 and improves the efficiency of the reduction process by eliminating side reactions involving oxygen.

The electrochemical reactions taking place in electrolyte 14 are shown in FIG. 1. The reaction at the surface of metallic oxide 20 is: $MO_2 + 4e^- + 4H^+ \rightarrow M + 2H_2O$, where M is a metal. The reaction at inert electrode 16 is: $2H_2O \rightarrow O_2 + 4e^- + 4H^+$. Thus, the net reaction for the system depicted in FIG. 1 is: $MO_2 \rightarrow M + O_2$. As a result, metallic oxide 20 is reduced to its metallic state to restore solderability of component 12.

Figure 2:
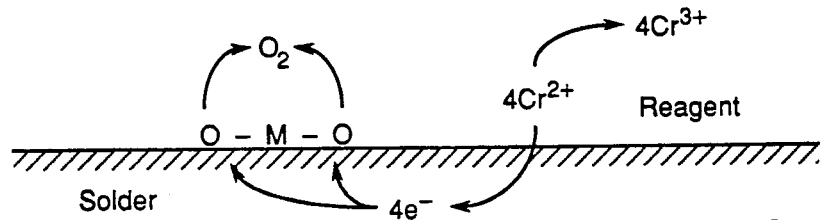
FIG. 2 is a schematic depiction of the electrochemical reduction of metallic oxides on an electronic component immersed in an active reducing agent in an electroless embodiment of the invention.

In a second, electroless variation of the method, which is illustrated schematically in FIG. 2, electrochemical reduction was performed on steam aged specimens immersed at room temperature in a reagent containing an active reducing agent. Reducing agents believed to be suitable for this process may be selected from the following: metal ions, including $Cr^{2+}$, $V^{2+}$, and $Eu^{2+}$; metal hydrides, including $BH_4^-$ ions, cyanoborohydrides, and $AlH_4^-$ ions; boranes, including dimethylaminoborane; nitrogen compounds, including hydrazine, substituted hydrazines, and hydroylamine; sulfur compounds, including sulfites, bisulfites, and dithionites; carbon compounds, including formaldehyde, formic acid, and oxalic acid and its salts; phosphorus compounds, including phosphorous acid and its salts and hypophosphorus acid and its salts; and oxohalogen compounds, including hypohalous salts and acids. The use of organic solvents, including alcohols, acetonitride, propylene carbonate, tetrahydrofuran, ethylene oxide, etc., may be advantageous in some cases, and is necessary for many of the hydride reducing agents.

The foregoing reducing agents, which are not expected to react with circuit boards and other electronic component materials, generate localized galvanic action between the solder/reagent and any metallic oxides present on the solder. Good results have been obtained, for example, with borohydride ions ($BH_4^-$) added as sodium borohydride, and with chromous ions ($Cr^{2+}$) generated by reaction of chromic ions ($Cr^{3+}$) with zinc metal in a Jones reactor under an argon atmosphere. As illustrated in FIG. 2, the reducing agent $Cr^{2+}$ (as an example) supplies electrons to the solder of the electronic component immersed in the electrolyte to electrochemically reduce the metallic oxides (illustrated as O—M—O) on the surface of the solder. This galvanic action takes place without the need for externally applied current, which makes this variation of the method particularly useful for reducing oxides on circuit boards having non-interconnected circuitry. In donating an electron, the chromous ion $Cr^{2+}$ becomes a chromic ion $Cr^{3+}$. In the system illustrated in FIG. 2, $Cr^{2+}$ can be regenerated from the $Cr^{3+}$ by-product by electrochemical reduction at an inert electrode (such as platinum, for example, not shown). In such a system, the anode would be enclosed within a separate electrolyte compartment isolated by a diffusion barrier, such as a glass frit, to minimize re-oxidation of the chromous ions that are generated. This embodiment would permit closed loop operation that conserves and regenerates the reducing agent and minimizes waste disposal problems.

In the electrolytic solutions of the present invention, the distance of closest approach of ions to the surface (i.e., thickness of the Helmholtz layer) is about 5–10 Å. At these small dimensions, electric field gradients as high as $10^7$ volts/cm can be derived from applied voltages of only about one volt. Therefore, the near ambient temperature electrochemical method of the present invention reduces metallic oxides that can be reduced chemically only at high temperatures. As described above, the applied voltage can be generated externally by an electric power source or internally by the local galvanic action produced by the reducing agent.

TABLE 1

| \multicolumn{5}{c}{Wetting Times (seconds) for Plated/Reflowed Eutectic Sn-Pb Solder after Various Treatments} | | | | |
|---|---|---|---|---|
| As-Reflowed (No Treatment) | Steam Aged (16 Hours) | Electrochemical Reduction | Reduction in $Cr^{2+}$ Solution | Reduction in $BH_4^-$ Solution |
| 3.9 | 10 | 3.1 | 3.8 | 3.0 |
| 4.3 | 12 | 3.1 | 5.4 | 3.1 |
| 4.5 | 21 | 3.4 | 4.1 | 3.4 |
| 7.0 | 11 | 3.9 | 3.4 | |
| 3.8 | 14 | 3.2 | 2.9 | |
| | 18 | *2.8 | 5.9 | |

TABLE 1-continued

Wetting Times (seconds) for Plated/Reflowed Eutectic Sn-Pb Solder after Various Treatments

| As-Reflowed (No Treatment) | Steam Aged (16 Hours) | Electro-chemical Reduction | Reduction in $Cr^{2+}$ Solution | Reduction in $BH_4^-$ Solution |
|---|---|---|---|---|
|  | 9 | *3.1 | 2.9 |  |
|  | 14 |  | 3.2 |  |
|  | 8 |  |  |  |
|  | 16 |  |  |  |
|  | 14 |  |  |  |
| Avg. 4.7 | 13 | 3.2 | 4.0 | 3.2 |

Table 1 lists wetting times and averages (in seconds) for similarly prepared eutectic Sn—Pb plated/reflowed specimens. The table lists wetting times for specimens subjected to the following treatments: as-reflowed (i.e., no treatment); steam aged at 95° C. for 16 hours; electrochemical reduction of steam aged specimens at $-225$ $\mu A/cm^2$ in a pH 8.3 borate buffer solution (specimens identified with * were reduced at $-20$ $\mu A/cm^2$); electroless reduction of steam aged specimens in a $Cr^{2+}$ solution (about 3 to 5 minutes); and electroless reduction of steam aged specimens in a $BH_4^-$ solution (about 5 minutes). Before reduction, the aged specimens were treated with an unactivated rosin (R) flux prior to the wetting balance test.

From the data presented in Table 1, it is clear that steam aging greatly degraded the solderability of the specimens (as indicated by the increased wetting times). The table also shows that all of the various oxide reduction treatments of the present invention were effective in restoring the solderability of the specimens. In addition, the experimental results showed that the average wetting times after the reduction treatments were less than the average wetting time of the as-reflowed (non-treated) specimens. This indicates that some degradation of solderability of the specimens had already occurred during the reflow process.

The absolute values of the wetting times presented in Table 1 are relatively long because of the unactivated rosin (R) flux and the thickness of the specimens (1.5 mm diameter), which presented large thermal inertia. Some test series of similar specimens yielded shorter wetting times because the particular specimens had inherently better solderability properties. The important point illustrated by the data in Table 1 is that the method of the present invention (either electrochemical or electroless reduction of metallic oxides) restores the metallic surfaces of solderable components to a state of good solderability.

Figure 3:
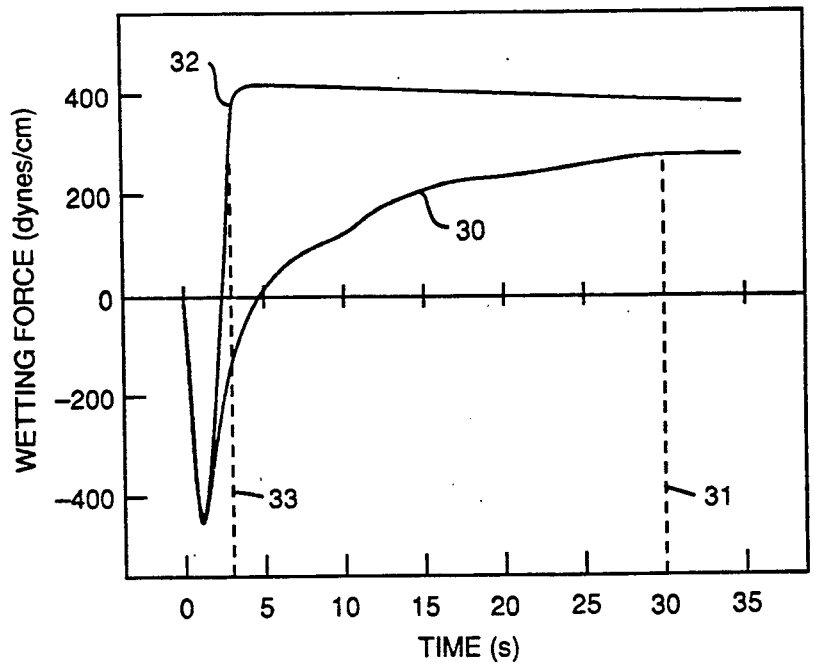
FIG. 3 is a graph plotting typical wetting force versus time for steam aged Sn—Pb coated specimens and for similar steam aged specimens reduced by the electrochemical reduction process of the present invention.

In FIG. 3, wetting balance results for steam aged specimens are compared graphically with aged specimens in which surface oxides were reduced by the method of the present invention. FIG. 3 plots the force measured by the wetting balance method versus time for Sn—Pb solder coated specimens. In the graph, curve 30 shows the wetting time (i.e., the time to reach dotted line 31, which marks a point at two-thirds of the theoretical wetting force) for a typical steam aged specimen without any treatment of the surface oxides. Curve 32 shows the wetting time for a typical steam aged specimen after electrochemical reduction of surface oxides using either of the reduction methods illustrated in FIGS. 1 or 2. Dotted line 33 marks a point at approximately two-thirds of the theoretical wetting force for the aged specimens after reduction of the metallic oxides. Line 33 indicates a short wetting time for the reduced specimens compared with line 31 for the aged specimens without oxide reduction. FIG. 3 clearly illustrates the vast improvement in solderability, as measured by wetting time, of aged specimens that have undergone surface oxide reduction using the method of the present invention.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A method of restoring solderability of an electronic component, comprising the steps of:
   immersing the electronic component in a reagent, the component including a solderable portion having one or more metallic oxides that degrade solderability;
   providing electrons to electrochemically reduce said metallic oxides;
   reducing essentially all of said metallic oxides to a metallic state; and
   removing the component from said reagent with solderability restored.

2. The method of claim 1, wherein said reagent comprises an electrolyte solution and the step of providing electrons further comprises:
   forming a first electrode comprising said immersed solderable portion of the component;
   immersing a second electrode in said electrolyte;
   connecting said first and second electrodes to an electric power source; and
   applying electric power to said first and second electrodes to electrochemically reduce essentially all of said metallic oxides to a metallic state.

3. The method of claim 2, wherein the steps of immersing said electrodes in an electrolyte solution comprise immersing said electrodes in a borate buffer solution.

4. The method of claim 1, wherein the step of immersing the component in a reagent comprises immersing the component in an active reducing agent in the absence of externally applied electric power.

5. The method of claim 4, further comprising the step of selecting said reducing agent from the group consisting of borohydride ions, chromous ions, dimethylamineborane, and hydrazine.

6. A method of restoring solderability of an electronic component by reducing metallic oxides that degrade solderability of a solderable portion of the component, comprising the steps of:
   providing a reagent;
   immersing at least the solderable portion of the electronic component in said reagent;
   providing electrons to electrochemically reduce the metallic oxides that degrade solderability of the solderable portion of the component;
   reducing essentially all of the metallic oxides of the solderable portion to a metallic state; and
   removing the component from said reagent with solderability of the solderable portion restored.

7. The method of claim 6, wherein said reagent comprises an electrolyte solution and the step of providing electrons further comprises:
   forming a first electrode comprising said immersed solderable portion of the component;

immersing a second electrode in said electrolyte;
connecting said first and second electrodes to an electric power source; and
applying electric power to said first and second electrodes to electrochemically reduce essentially all of the metallic oxides of the solderable portion to a metallic state.

8. The method of claim 7, wherein the steps of immersing said electrodes in an electrolyte solution comprise immersing said electrodes in a borate buffer solution.

9. The method of claim 6, wherein the step of immersing the component in a reagent comprises immersing the component in an active reducing agent in the absence of externally applied electric power.

10. The method of claim 9, further comprising the step of selecting said reducing agent from the group consisting of metal hydrides, metal ions, boranes, hydroylamine, sulfites, formaldehyde, oxalic acids, phosphorous acids, oxohalogens, and hydrazine.

11. A method of restoring solderability of an electronic component having solderable and non-solderable portions by electrochemically reducing metallic oxides that degrade solderability of the solderable portions of the component, comprising the steps of:
providing a reagent, said reagent being non-reactive with the non-solderable portions of the electronic component;
immersing the electronic component in said reagent;
providing electrons to electrochemically reduce the metallic oxides that degrade solderability of the solderable portions of the component;
reducing essentially all of the metallic oxides of the solderable portions to a metallic state; and
removing the component from said reagent with solderability of the solderable portions restored.

12. The method of claim 11, wherein said reagent comprises an electrolyte solution and the step of providing electrons further comprises:
forming a first electrode comprising said immersed solderable portions of the component;
immersing a second electrode in said electrolyte;
connecting said first and second electrodes to an electric power source; and
applying electric power to said first and second electrodes to electrochemically reduce essentially all of the metallic oxides of the solderable portions to a metallic state.

13. The method of claim 12, wherein the steps of immersing said electrodes in an electrolyte solution comprise immersing said electrodes in a borate buffer solution.

14. The method of claim 11, wherein the electronic component comprises a printed wiring board and the step of immersing the component in a reagent comprises immersing the printed wiring board in an active reducing agent in the absence of externally applied electric power, said active reducing agent providing said electrons for reducing the metallic oxides of the solderable portions of the printed wiring board.

15. The method of claim 14, further comprising the step of selecting said reducing agent from the group consisting of metal hydrides including borohydride ions and cyanoborohydrides, metal ions including chromous ions and vanadous ions, boranes including dimethylamineborane, hydrazine, hydroylamine, sulfites, bisulfites, dithionites, formaldehyde, formic acid, oxalic acid and its salts, phosphorous acid and its salts, hypophosphorous acid and its salts, and oxohalogens.

* * * * *